US009368247B2

(12) United States Patent
Umeda

(10) Patent No.: US 9,368,247 B2
(45) Date of Patent: Jun. 14, 2016

(54) THIN FILM DEVICE AND METHOD FOR MANUFACTURING THIN FILM DEVICE

(71) Applicant: MURATA MANUFACTURING CO., LTD., Kyoto (JP)

(72) Inventor: Keiichi Umeda, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 324 days.

(21) Appl. No.: 14/086,639

(22) Filed: Nov. 21, 2013

(65) Prior Publication Data

US 2014/0078640 A1 Mar. 20, 2014

Related U.S. Application Data

(63) Continuation of application No. PCT/JP2012/067535, filed on Jul. 10, 2012.

(30) Foreign Application Priority Data

Jul. 15, 2011 (JP) .................................. 2011-156201

(51) Int. Cl.
*H01B 1/02* (2006.01)
*H01G 5/16* (2006.01)
(Continued)

(52) U.S. Cl.
CPC .............. *H01B 1/02* (2013.01); *B81C 1/00666* (2013.01); *B81C 1/00698* (2013.01); *C23C 14/025* (2013.01); *C23C 14/165* (2013.01); *C23C 14/34* (2013.01); *H01G 4/33* (2013.01); *H01G 5/16* (2013.01); *H03H 9/131* (2013.01); *H03H 9/173* (2013.01); *H03H 9/2457* (2013.01); *B81B 2201/0221* (2013.01); *B81B 2203/04* (2013.01); *B81C 2201/017* (2013.01); *B81C 2201/0181* (2013.01); *H03H 2003/021* (2013.01);
(Continued)

(58) Field of Classification Search
CPC ............... H01G 5/16; H01G 4/33; H01B 1/02
See application file for complete search history.

(56) References Cited

U.S. PATENT DOCUMENTS 4,782,380 A * 11/1988 Shankar ............ H01L 23/53223
257/751
6,123,606 A 9/2000 Hill et al.
(Continued)

FOREIGN PATENT DOCUMENTS

JP 2003-039392 A 2/2003
JP 2003-297445 A 10/2003
(Continued)

OTHER PUBLICATIONS

International Search Report; PCT/JP2012/067535; Oct. 16, 2012.
(Continued)

*Primary Examiner* — David M Sinclair
(74) *Attorney, Agent, or Firm* — Studebaker & Brackett PC

(57) ABSTRACT

In a thin film device including a thin film electrode which has a main electrode layer formed of tungsten, a thin film electrode having a low resistivity is realized. There is provided a thin film device including a thin film electrode that has an underlayer and a main electrode layer formed on the underlayer. The underlayer is formed of a titanium-tungsten alloy having a crystalline structure with a wavy-like surface morphology, and the main electrode layer is formed of tungsten having a crystalline structure with a wavy-like surface morphology.

9 Claims, 10 Drawing Sheets

(51) Int. Cl.
*H01G 4/33* (2006.01)
*B81C 1/00* (2006.01)
*H03H 9/17* (2006.01)
*C23C 14/16* (2006.01)
*C23C 14/34* (2006.01)
*H03H 9/24* (2006.01)
*H03H 9/13* (2006.01)
*C23C 14/02* (2006.01)
*H03H 3/02* (2006.01)
*H03H 3/04* (2006.01)
*H03H 9/02* (2006.01)

(52) U.S. Cl.
CPC ............... *H03H2003/0428* (2013.01); *H03H 2009/02291* (2013.01)

(56) References Cited

U.S. PATENT DOCUMENTS

| | | | |
|---|---|---|---|
| 6,166,620 A | 12/2000 | Inuzuka et al. | |
| 7,325,457 B2* | 2/2008 | Fujimori | B60C 23/0408 361/283.1 |
| 7,723,822 B2* | 5/2010 | Inaba | B81B 3/0005 257/522 |
| 2006/0016474 A1 | 1/2006 | Shiratsuchi et al. | |
| 2006/0267206 A1 | 11/2006 | Tanida et al. | |
| 2009/0159410 A1 | 6/2009 | Wang et al. | |

FOREIGN PATENT DOCUMENTS

| | | |
|---|---|---|
| JP | 2004-105930 A | 4/2004 |
| JP | 3668935 B2 | 7/2005 |
| JP | 2006-032227 A | 2/2006 |
| JP | 2006-060067 A | 3/2006 |
| JP | 2007-243143 A | 9/2007 |
| JP | 2009-152194 A | 7/2009 |
| JP | 2010-005786 A | 1/2010 |
| WO | 1998/058390 A1 | 12/1998 |

OTHER PUBLICATIONS

Written Opinion of the International Searching Authority; PCT/JP2012/067535; Oct. 16, 2012.

* cited by examiner

FIG. 3
(A)
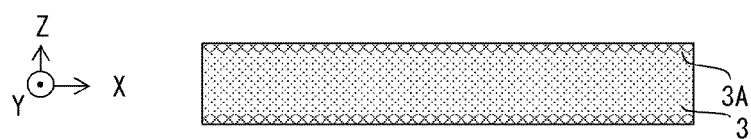
(B)
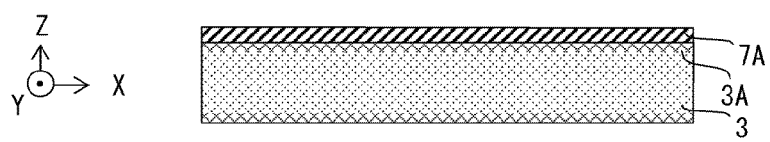
(C)
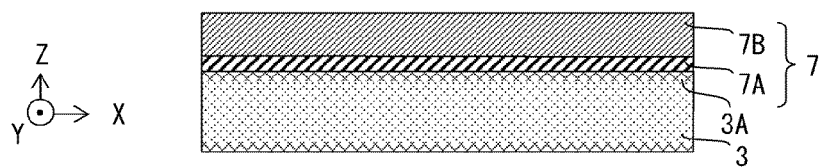

(A)

| | TITANIUM-TUNGSTEN ALLOY (TiW) | | | |
|---|---|---|---|---|
| GAS PRESSURE (Pa) | TiW(110) | TiW(200) | TiW(211) | TiW(200)/(110) |
| 0.850 | 20.93 | 0.48 | 1.44 | 0.0228 |
| 0.600 | 66.08 | 0.10 | 0.62 | 0.0014 |
| 0.200 | 250.99 | 0.00 | 0.00 | 0.0000 |

(B)

THIN FILM DEVICE AND METHOD FOR MANUFACTURING THIN FILM DEVICE

CROSS REFERENCE TO RELATED APPLICATIONS

The present application is a continuation of International Application No. PCT/JP2012/067535 filed on Jul. 10, 2012, and claims priority to Japanese Patent Application No. 2011-156201 filed on Jul. 15, 2011, the entire contents of each of these applications being incorporated herein by reference in their entirety.

TECHNICAL FIELD

The technical field relates to a thin film device including a thin film electrode formed of tungsten and a method for manufacturing a thin film device.

BACKGROUND

As a thin film device, there may be mentioned an MEMS (Micro Electro Mechanical Systems) device in which a fixed member and a moving member, each of which is provided with an electrode, are disposed to face each other with a gap space interposed therebetween, and the moving member is displaced by applying a signal to the electrodes. See, for example, Japanese Unexamined Patent Application Publication No. 2003-39392 (Patent Document 1) and Japanese Unexamined Patent Application Publication No. 2009-152194 (Patent Document 2). By the MEMS device as described above, a switch, an actuator, a variable capacity element, a high frequency filter, and the like are formed.

For example, Patent Document 1 has disclosed an MEMS switch having a fixed member which includes a substrate formed of single crystalline silicon and projections formed thereon; and a moving member formed of single crystalline silicon, and in this MEMS switch, the fixed member and the moving member are disposed to face each other with a gap space interposed therebetween. The projections are each formed of a thin film electrode containing gold and chromium laminated to each other. Patent Document 2 has disclosed an MEMS switch having a fixed member which includes a substrate formed of silicon and germanium and a substrate contact formed on the substrate; and a moving member formed of gold or a gold alloy, and in this MEMS switch, the fixed member and the moving member are disposed to face each other with a gap space interposed therebetween. The substrate contact is formed of gold or a gold alloy.

SUMMARY

The present disclosure provides a thin film device including a thin film electrode which is formed of tungsten and which has a low resistivity and a method for manufacturing the thin film device described above.

One aspect of the present disclosure relates to a thin film device having a thin film electrode which includes an underlayer and a main electrode layer formed thereon. The underlayer is formed of a titanium-tungsten alloy having a crystalline structure with a wavy-like surface morphology. The main electrode layer is formed of tungsten having a crystalline structure with a wavy-like surface morphology.

In addition, another aspect of the present disclosure relates to a thin film device having a thin film electrode which includes an underlayer and a main electrode layer formed thereon. The underlayer is formed of a titanium-tungsten alloy having diffraction peaks from the (110) plane, the (200) plane, and the (211) plane by an x-ray diffraction method. The main electrode layer is formed of tungsten.

In a more specific embodiment, the main electrode layer is formed of tungsten having diffraction peaks from the (110) plane, the (200) plane, and the (211) plane by an x-ray diffraction method.

In another more specific embodiment, the underlayer of the thin film device described above may be a layer having a ratio of $1.4 \times 10^{-3}$ or more, the ratio being a ratio by an x-ray diffraction method of the peak intensity of the diffraction peak from the (200) plane to the peak intensity of the diffraction peak from the (110) plane.

In yet another more specific embodiment, the thin film device described above may have the structure in which a silicon dioxide film is formed under the underlayer.

Another aspect of the present disclosure relates to a method for manufacturing the thin film device described above, and in the method described above, an underlayer-forming step of forming an underlayer by a sputtering method at a gas pressure of 0.65 Pa or more and a main electrode layer-forming step of forming a main electrode layer on the underlayer are performed in this order. In the method described above, the underlayer and the main electrode layer can be each formed to have a crystalline structure with a wavy-like surface morphology.

BRIEF DESCRIPTION OF DRAWINGS

FIGS. 3(A) to 3(C) are views each illustrating a method for forming the thin film electrode of the first embodiment.

DETAILED DESCRIPTION

In a thin film device, in order to decrease the fluctuation in characteristics caused by the change in temperature, a difference in coefficient of linear expansion between members is reduced. In addition, when a moving member is provided as in the case of an MEMS device, a member excellent in durability, or robust, is used. Furthermore, materials of individual members are determined in consideration of various points, such as adhesion between the members, minimization of internal stress, densities, manufacturing methods, and the like.

In the thin film device, in view of microfabrication accuracy, a silicon-based member, such as single crystalline silicon, may be used in some cases. In a thin film device using a silicon-based member, a thin film electrode formed of tungsten may be used in some cases. Since having a coefficient of linear expansion similar to that of silicon and being excellent in durability, tungsten is preferably used as a material for the thin film electrode. A thin film electrode composed of tungsten is formed by a sputtering method. However, the inventor realized that the thin film electrode formed of tungsten can have a high resistivity in some cases, and hence, the power consumption of the thin film device can unfavorably increase in some cases. In addition, the thin film electrode formed of tungsten may have a low adhesion to silicon dioxide ($SiO_2$) or the like, and as a result, the thin film electrode may be peeled off from a substrate in some cases.

Hereinafter, an exemplary method for manufacturing a thin film device of a first exemplary embodiment will be described using a variable capacity element which is an MEMS device as an example of the thin film device.

Figure 1:
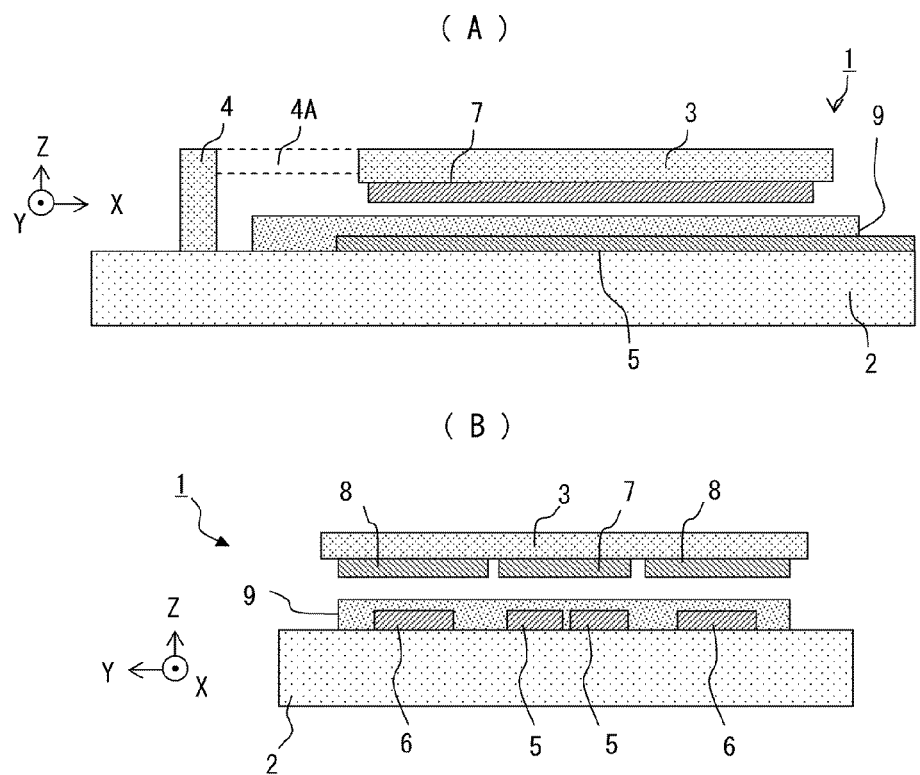
FIGS. 1(A) to 1(C) are views each illustrating the structure of a thin film device of a first exemplary embodiment.

FIG. 1(A) is a transverse cross-sectional view (X-Z cross-sectional view) of a variable capacity element 1 of this embodiment; FIG. 1(B) is a longitudinal cross-sectional view (Y-Z cross-sectional view) of the variable capacity element 1; and FIG. 1(C) is a transverse cross-sectional view (X-Z cross-sectional view) of the variable capacity element 1 in a driven state.

As shown in FIGS. 1(A) and 1(B), the variable capacity element 1 includes a fixed plate 2, a moving plate 3, and an anchor portion 4. The fixed plate 2 is a flat plate formed of a glass or single crystalline silicon, and the normal direction of its primary surface is a Z-axis direction. The moving plate 3 is a flat plate formed of single crystalline silicon, and a Z-axis direction and an X-axis direction thereof are called a thickness direction and a longitudinal direction, respectively. The anchor portion 4 is bonded to the fixed plate 2 and is also connected to one end (fixed end) of the moving plate 3 in a longitudinal direction with a spring-shaped portion 4A represented by a dotted line in FIGS. 1(A) and 1(C). As described above, the anchor portion 4 supports the moving plate 3 so that the moving plate 3 faces the fixed plate 2 with a gap space interposed therebetween.

As shown in FIGS. 1(A) and 1(B), the fixed plate 2 is provided on a surface thereof facing the moving plate 3 with fixed plate-side thin film electrodes 5 and 6 and a dielectric film 9. The fixed plate-side thin film electrodes 5 and 6 are each formed on the primary surface of the fixed plate 2 so that a longer side of the electrode is along the X-axis direction. The fixed plate-side thin film electrodes 5 and 6 are formed so as to face the moving plate 3. The dielectric film 9 covers the fixed plate-side thin film electrodes 5 and 6 and part of the primary surface of the fixed plate 2 and is provided over approximately the entire region of the primary surface of the fixed plate 2 that faces the moving plate 3.

In addition, since the thickness of the fixed plate 2 is sufficiently larger than that of the moving plate 3, even if the coefficient of linear expansion of the fixed plate 2 is remarkably different from that of the fixed plate-side thin film electrodes 5 and 6 and that of the dielectric film 9, the deformation caused by heat hardly occurs. Hence, a material of the fixed plate-side thin film electrodes 5 and 6 may be selected without any restriction of the coefficient of linear expansion, and the fixed plate-side thin film electrodes 5 and 6 may be formed from a metal, such as aluminum, copper, or gold, having a low resistance. As is the case described above, the dielectric film 9 may be formed, for example, from silicon dioxide, silicon nitride, aluminum oxide, tantalum oxide, hafnium oxide, lanthanum oxide, zirconium oxide, aluminum nitride, zinc oxide, lead zirconate titanate, or barium titanate.

As shown in FIGS. 1(A) and 1(B), the moving plate 3 is provided on a surface thereof facing the fixed plate 2 with moving plate-side thin film electrodes 7 and 8. The moving plate-side thin film electrodes 7 and 8 are each formed on the moving plate 3 so that a longer side of the electrode is along the X-axis direction. The moving plate-side thin film electrodes 7 and 8 are formed to face the fixed plate-side thin film electrodes 5 and 6 with the gap space and the dielectric film 9 interposed therebetween.

The fixed plate-side thin film electrodes 6 and the moving plate-side thin film electrodes 8 are each a drive electrode. When a drive DC voltage is applied between the moving plate-side thin film electrode 8 and the fixed plate-side thin film electrode 6 facing thereto, a drive capacity is formed between the moving plate-side thin film electrode 8 and the fixed plate-side thin film electrode 6, and an electrostatic attractive force is generated. As shown in FIG. 1(C), when the drive DC voltage is increased, the drive capacity and also the electrostatic attractive force are increased. As a result, the moving plate 3 moves from a front-end side thereof toward the dielectric film 9, and the moving plate-side thin film electrodes 7 and 8 are brought into contact with the dielectric film 9 from the front-end side of the moving plate 3. The contact area between the moving plate-side thin film electrodes 7 and 8 and the dielectric film 9 is continuously changed in accordance with the drive DC voltage. While the moving plate-side thin film electrodes 7 and 8 are in contact with the dielectric film 9, when the drive DC voltage is decreased or set to zero, the drive capacity and also the electrostatic attractive force are decreased or set to zero. As a result, the moving plate 3 is returned to a predetermined state by the elasticity of the moving plate 3, and hence the moving plate-side thin film electrodes 7 and 8 also move apart from the dielectric film 9.

The fixed plate-side thin film electrodes 5 and the moving plate-side thin film electrodes 7 are each an RF capacity electrode. Between the fixed plate-side thin film electrodes 5 and the moving plate-side thin film electrode 7 facing thereto, an RF capacity (capacitance) is formed. This RF capacity is continuously changed in accordance with the distance between the moving plate-side thin film electrode 7 and the dielectric film 9 and with the contact area therebetween. Hence, the variable capacity element 1 has an RF capacity which is continuously changed in accordance with the drive DC voltage.

Figure 2:
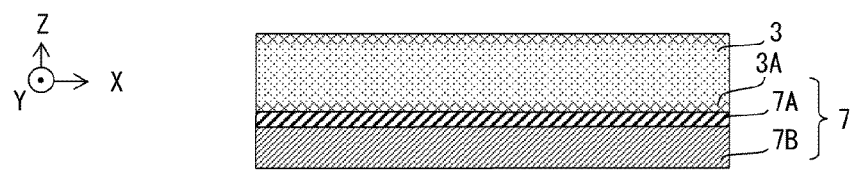
FIG. 2 is a view illustrating the structure of a thin film electrode of the first embodiment.

FIG. 2 is a view illustrating the structure of the moving plate 3 and that of the moving plate-side thin film electrode 7. In addition, the moving plate-side thin film electrode 8 (not shown) can have the same structure as that of the moving plate-side thin film electrode 7.

The moving plate 3 is formed of single crystalline silicon and is provided on the surface thereof with a silicon dioxide ($SiO_2$) film 3A. The silicon dioxide film 3A may be a film formed by oxidizing the moving plate 3 formed of single crystalline silicon or may be a film formed on the surface of the moving plate 3. For example, the silicon dioxide film 3A has a thickness of 40 nm, and the moving plate 3 has a thickness of 40 μm.

The moving plate-side thin film electrode 7 has an underlayer 7A and a main electrode layer 7B. The underlayer 7A is formed of a titanium-tungsten alloy, and the main electrode layer 7B is formed of tungsten. In particular, the underlayer 7A is formed of a titanium-tungsten alloy having a crystalline structure with a wavy-like surface morphology, and the main electrode layer 7B is formed of tungsten having a crystalline structure with a wavy-like surface morphology. For example, the underlayer 7A has a thickness of 10 nm, and the main electrode layer 7B has a thickness of 500 nm. The underlayer 7A and the main electrode layer 7B are each formed by a sputtering method.

In general, although the resistivity of a titanium-tungsten alloy is remarkably high, such as approximately 20 times, as compared to that of tungsten, since the thickness of the underlayer 7A is significantly smaller than that of the main electrode layer 7B, in the resistivity of the moving plate-side thin film electrode 7, the resistivity of tungsten is dominant. The resistivity of tungsten tends to change depending on the crystalline structure. Tungsten generally has a crystalline structure with a grain surface morphology. However, depending on film formation conditions, tungsten may have a crystalline structure with a wavy-like surface morphology in some cases. Tungsten having a crystalline structure with a wavy-like surface morphology has a low resistivity as compared to that of tungsten having crystalline structure with a grain surface morphology. Since the main electrode layer 7B is formed of tungsten having a crystalline structure with a wavy-like surface morphology, the resistivity of the moving plate-side thin film electrode 7 is low.

In addition, although tungsten forming the main electrode layer 7B has a low adhesion to the silicon dioxide film 3A, a titanium-tungsten alloy forming the underlayer 7A has a high adhesion to both tungsten and silicon dioxide. Hence, when the main electrode layer 7B is provided on the moving plate 3 with the underlayer 7A interposed therebetween, the moving plate 3 and the moving plate-side thin film electrode 7 can be tightly adhered to each other.

In addition, the coefficient of linear expansion of tungsten forming the main electrode layer 7B is $4.5 \times 10^{-6} K^{-1}$, and the coefficient of linear expansion of single crystalline silicon forming the moving plate 3 is $2.4 \times 10^{-6} K^{-1}$. Since the difference in coefficient of linear expansion between the above two members is small, even if the moving plate 3 is exposed to a high temperature, deformation of the moving plate-side thin film electrode 7 caused by a stress can be significantly reduced.

In addition, tungsten forming the main electrode layer 7B has a high Young's modulus, such as approximately 411 GPa, and is excellent in abrasion resistance. Hence, even when operation in which the main electrode layer 7B is brought into contact with the dielectric film 9 and is then taken away therefrom is repeatedly performed, the main electrode layer 7B is not deformed.

In addition, the main electrode layer 7B is formed so as to reduce the internal stress of the moving plate 3 and that of the moving plate-side thin film electrode 7. Hence, the moving plate 3 and the moving plate-side thin film electrode 7 are each not distorted by the internal stress, and as a result, a significantly flat shape can be formed.

FIG. 3 includes views each schematically illustrating an exemplary method for forming the moving plate-side thin film electrodes 7 and 8. In addition, in order to simplify the description, although the moving plate-side thin film electrode 8 will not be described nor shown in this embodiment, the moving plate-side thin film electrodes 7 and 8 are formed by the same process.

First, the moving plate 3 is prepared and the silicon dioxide film 3A is provided on the surface thereof. In addition, after the moving plate 3 is disposed in a sputtering apparatus, by a sputtering method using an argon gas and a target formed of a titanium-tungsten alloy, the underlayer 7A is formed from a titanium-tungsten alloy. In this step, by controlling the argon gas pressure, the underlayer 7A is formed from a titanium-tungsten alloy so as to have a crystalline structure with a wavy-like surface morphology.

Next, after the target described above is removed, the main electrode layer 7B is formed from tungsten by a sputtering method using an argon gas and a target formed of tungsten. In this step, by controlling the argon gas pressure, the internal stress of the main electrode layer 7B is controlled, and the main electrode layer 7B is formed from tungsten so as to reduce the internal stress of the moving plate 3 and that of the moving plate-side thin film electrode 7. Because the underlayer 7A is formed of a titanium-tungsten alloy having a crystalline structure with a wavy-like surface morphology, the main electrode layer 7B formed of tungsten has a crystalline structure with a wavy-like surface morphology.

Hereinafter, the crystalline structure of tungsten and that of a titanium-tungsten alloy will be described in detail.

Figure 4:
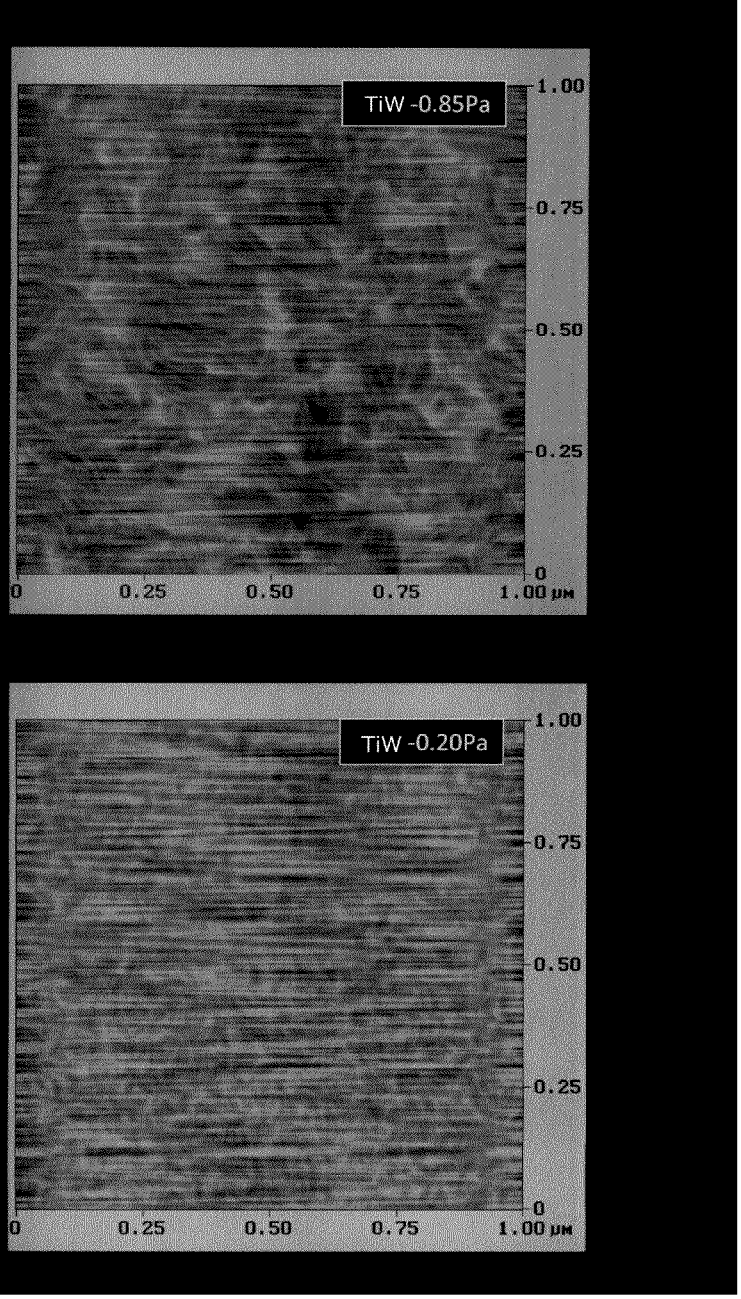
FIGS. 4(A) and 4(B) are views each showing a surface morphology of an underlayer by way of example.

FIGS. 4(A) and 4(B) are views each showing a surface morphology of a titanium-tungsten alloy by way of example. FIGS. 4(A) and 4(B) include photos taken by an electron microscope. FIG. 4(A) shows the underlayer 7A formed of a titanium-tungsten alloy having a crystalline structure with a wavy-like surface morphology, and FIG. 4(B) shows an underlayer of a comparative example formed of a titanium-tungsten alloy having a crystalline structure with a grain surface morphology. The underlayer 7A shown in FIG. 4(A) is formed by a sputtering method at an argon gas pressure of 0.85 Pa. The underlayer shown in FIG. 4(B) is formed by a sputtering method at an argon gas pressure of 0.20 Pa. The underlayer 7A and the underlayer of the comparative example are formed under the same film formation conditions except for the argon gas pressure. In addition, in both FIGS. 4(A) and 4(B), although a plurality of transverse lines is viewed, those lines indicate noises caused by scanning of an electron microscope probe.

When a film is formed from a titanium-tungsten alloy by a sputtering method, the argon gas pressure is generally set to approximately 0.20 Pa. A titanium-tungsten alloy film formed at a general gas pressure as described above has a crystalline structure with a grain surface morphology as shown in FIG. 4(B). On the other hand, as shown in FIG. 4(A), a titanium-tungsten alloy film formed at a higher pressure, such as 0.85 Pa, than the general gas pressure has a crystalline structure with a wavy-like surface morphology instead of a grain surface morphology.

Figure 5:
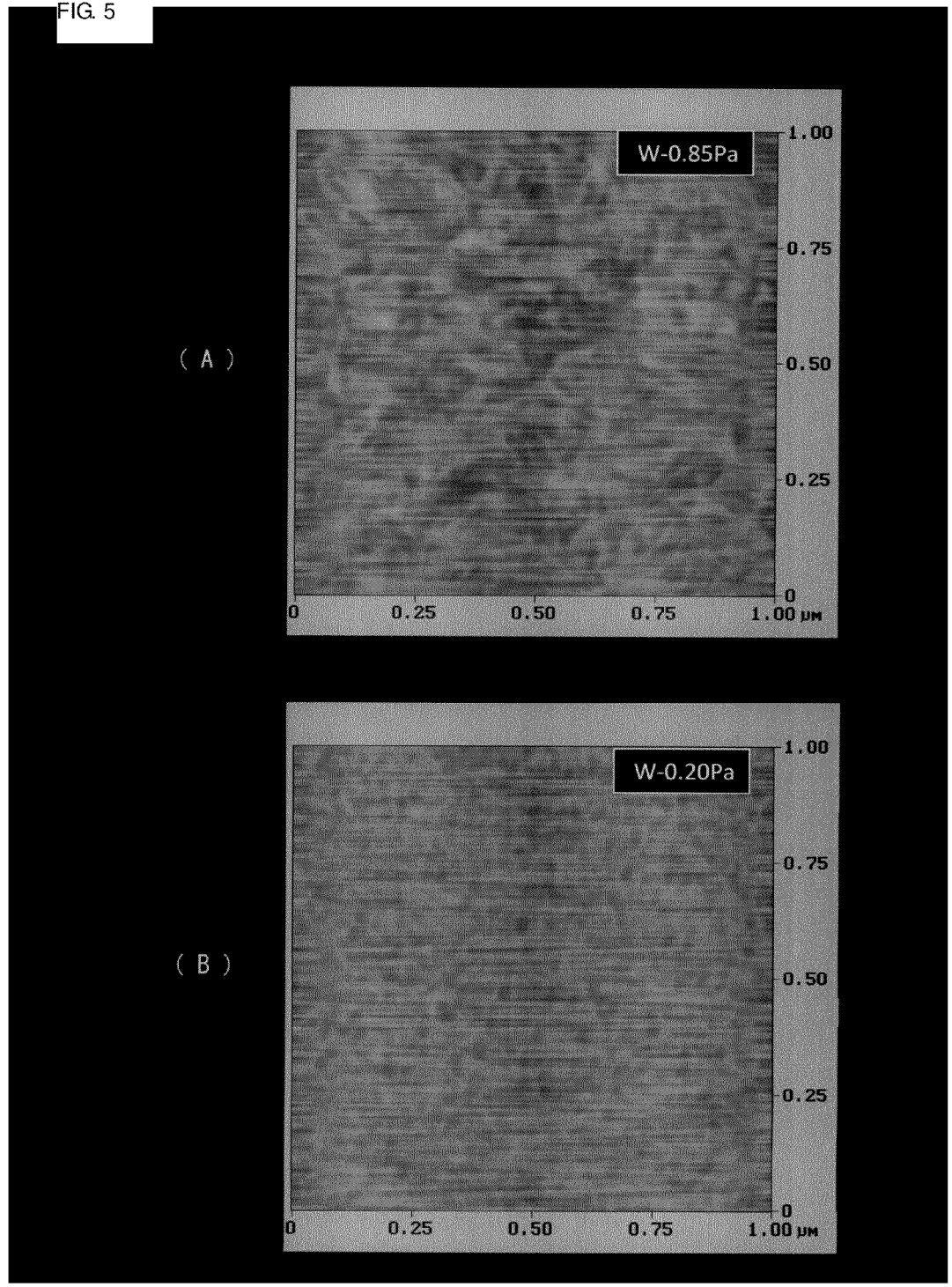
FIGS. 5(A) and 5(B) are views each showing a surface morphology of a main electrode layer by way of example.

FIGS. 5(A) and 5(B) are views each showing a surface morphology of tungsten by way of example. As is FIGS. 4(A) and 4(B), FIGS. 5(A) and 5(B) include photos taken by an electron microscope. FIG. 5(A) shows the main electrode layer 7B formed of tungsten having a crystalline structure with a wavy-like surface morphology, and FIG. 5(B) shows a main electrode layer of a comparative example formed of tungsten having a crystalline structure with a grain surface morphology. The main electrode layer 7B shown in FIG. 5(A) is formed on the underlayer 7A shown in FIG. 4(A). The main electrode layer shown in FIG. 5(B) is formed on the underlayer of the comparative example shown in FIG. 4(B). The main electrode layer 7B and the main electrode layer of the comparative example are formed under the same film formation conditions except for the underlayer. In addition, in both FIGS. 5(A) and 5(B), although a plurality of transverse lines is viewed, those lines indicate noises caused by scanning of an electron microscope probe.

When formed on the underlayer 7A which is formed of a titanium-tungsten alloy having a crystalline structure with a wavy-like surface morphology, the tungsten film has a crystalline structure with a wavy-like surface morphology as shown in FIG. 5(A). When formed on the underlayer of the comparative example which is formed of a titanium-tungsten alloy having a crystalline structure with a grain surface morphology, the tungsten film has a crystalline structure with a grain surface morphology as shown in FIG. 5(B). As described above, a tungsten film formed on an underlayer formed of a titanium-tungsten alloy has the same crystalline structure as that of the underlayer.

Figure 6:
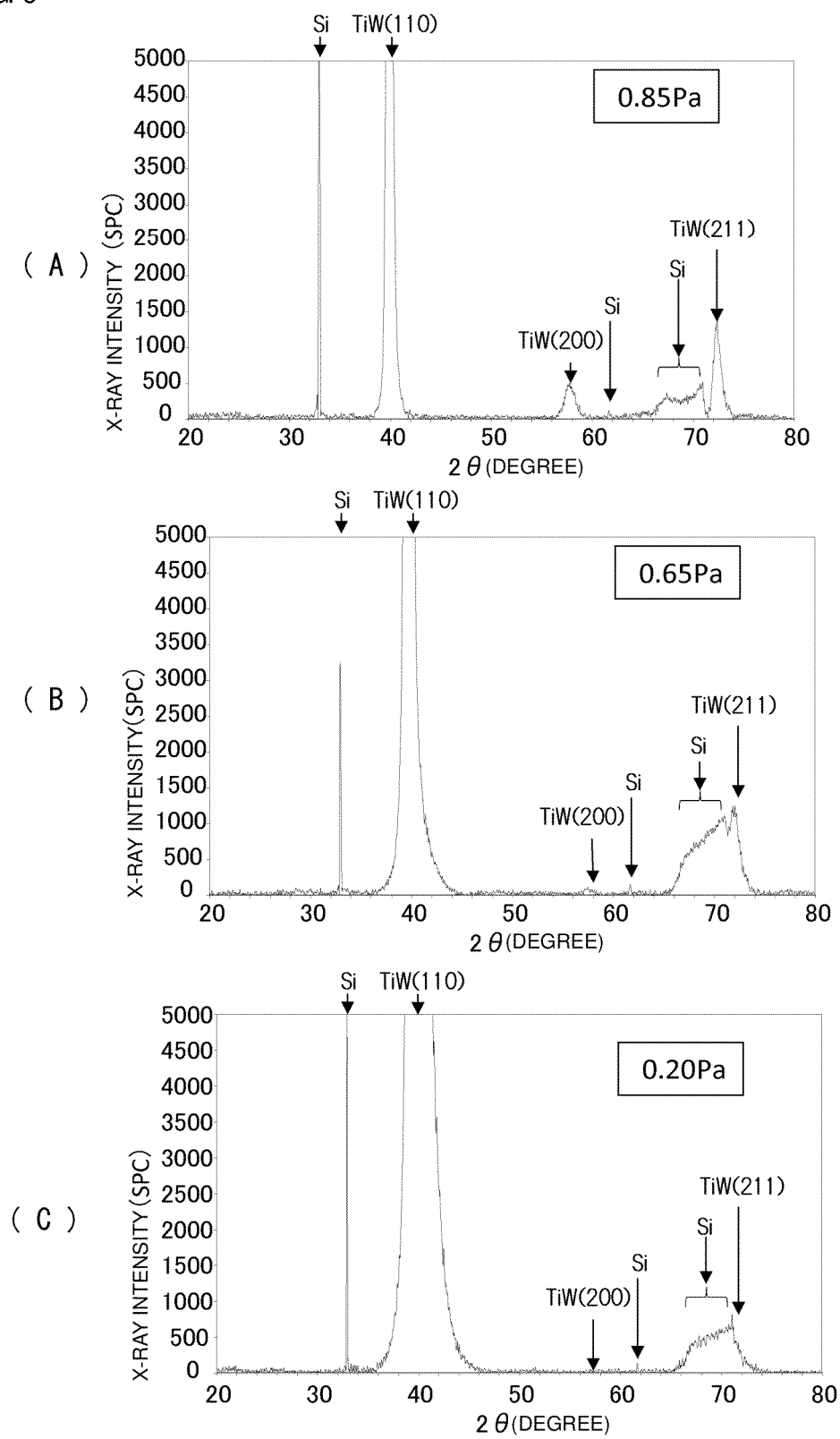
FIGS. 6(A) to 6(C) are views each showing x-ray diffraction intensity characteristics of the underlayer by way of example.

FIGS. 6(A) to 6(C) are views showing the results obtained by analyzing the crystalline structure of a titanium-tungsten alloy using an x-ray diffraction method (θ-2θ method). A sample used in this analysis includes a substrate formed of single crystalline silicon and a conductive layer formed thereon from a titanium-tungsten alloy by a sputtering method. In this case, the conductive layer formed from a titanium-tungsten alloy is an underlayer. In particular, by a sputtering method which uses an argon gas and a target formed of a titanium-tungsten alloy, the content of titanium of which is 10 percent by weight, and which is performed at a sputtering electrical power of 2,000 W, a conductive layer having a thickness of 100 nm is formed on the substrate from a titanium-tungsten alloy. In this case, after the conductive layer is formed by changing the argon gas pressure in film formation, the crystalline structure of the conductive layer formed of a titanium-tungsten alloy is analyzed by an x-ray diffraction method (θ-2θ method).

FIG. 6(A) shows x-ray diffraction intensity characteristics obtained when analysis is performed by an x-ray diffraction method (θ-2θ method) on the crystalline structure of a conductive layer formed from a titanium-tungsten alloy at an argon gas pressure of 0.85 Pa in film formation.

As shown in FIG. 6(A), in this conductive layer, diffraction peaks of a titanium-tungsten alloy are present at approximately 40°, 58°, and 72°. The peak at approximately 40° is a diffraction peak from the (110) plane of a titanium-tungsten alloy. The peak at approximately 58° is a diffraction peak from the (200) plane of a titanium-tungsten alloy. The peak at approximately 72° is a diffraction peak from the (211) plane of a titanium-tungsten alloy. In addition, this conductive layer is formed of a titanium-tungsten alloy having a crystalline structure with a wavy-like surface morphology. In addition, at approximately 33°, 62°, and 70°, diffraction peaks of the substrate formed of single crystalline silicon are present. Although the diffraction peak of the substrate formed of single crystalline silicon detected at approximately 70° originally has a higher peak intensity, in order to easily visually recognize the diffraction peak from the (211) plane of a titanium-tungsten alloy at approximately 72°, the diffraction peak at approximately 70° is shown by correction to have a low peak intensity. In the following views, the correction similar to that described above is also performed.

FIG. 6(B) shows x-ray diffraction intensity characteristics obtained when analysis is performed by an x-ray diffraction method (θ-2θ method) on the crystalline structure of a conductive layer formed from a titanium-tungsten alloy at an argon gas pressure of 0.65 Pa in film formation.

As shown in FIG. 6(B), in this conductive layer, diffraction peaks of a titanium-tungsten alloy are present at approximately 40°, 58°, and 72°. The peak at approximately 40° is a diffraction peak from the (110) plane of a titanium-tungsten alloy. The peak at approximately 58° is a diffraction peak from the (200) plane of a titanium-tungsten alloy. The peak at approximately 72° is a diffraction peak from the (211) plane of a titanium-tungsten alloy. The peak intensity at approximately 58° is very low. In addition, this conductive layer is formed of a titanium-tungsten alloy having a crystalline structure with a wavy-like surface morphology. In addition, at approximately 33°, 62°, and 70°, diffraction peaks of the substrate formed of single crystalline silicon are present.

FIG. 6(C) shows x-ray diffraction intensity characteristics obtained when analysis is performed by an x-ray diffraction method (θ-2θ method) on the crystalline structure of a conductive layer formed from a titanium-tungsten alloy at an argon gas pressure of 0.2 Pa in film formation.

As shown in FIG. 6(C), in this conductive layer, diffraction peaks of a titanium-tungsten alloy are present at approximately 40° and 72°. The diffraction peak of a titanium-tungsten alloy cannot be confirmed at approximately 58°. The peak at approximately 40° is a diffraction peak from the (110) plane of a titanium-tungsten alloy. The peak at approximately 72° is a diffraction peak from the (211) plane of a titanium-tungsten alloy. The peak intensity at approximately 72° is very low. In addition, this conductive layer is formed of a titanium-tungsten alloy having a crystalline structure with a grain surface morphology. In addition, at approximately 33°, 62°, and 70°, diffraction peaks of the substrate formed of single crystalline silicon are present.

As apparent from FIGS. 6(A) to 6(C), when the argon gas pressure for forming the conductive layer from a titanium-tungsten alloy is low, the peak at approximately 58°, which is the diffraction peak from the (200) plane of a titanium-tungsten alloy, and the peak at approximately 72°, which is the diffraction peak from the (211) plane of a titanium-tungsten alloy, may be observed to have a remarkably low peak intensity or may not be observed in some cases. In other words, when the argon gas pressure is increased in film formation, the peak at approximately 58°, which is the diffraction peak from the (200) plane of a titanium-tungsten alloy, and the peak at approximately 72°, which is the diffraction peak from the (211) plane of a titanium-tungsten alloy, are each observed to have a high peak intensity. In addition, as apparent from FIGS. 6(A) to 6(C), as the argon gas pressure in film formation is decreased, the peak at approximately 40°, which is the diffraction peak from the (110) plane of a titanium-tungsten alloy, is shifted to a lower angle, and the peak intensity thereof is increased.

The phenomenon described above indicates that the crystalline structure of a titanium-tungsten alloy is changed in accordance with the argon gas pressure in film formation. That is, it is found that when the argon gas pressure in film formation is set to be high, the conductive layer formed of a titanium-tungsten alloy has a crystalline structure with a wavy-like surface morphology, and that when the argon gas pressure in film formation is set to be low, the conductive layer formed of a titanium-tungsten alloy has a crystalline structure with a grain surface morphology. The reason for this is believed that when the gas pressure is high, grains of a titanium-tungsten alloy have low energy when reaching the vicinity of the substrate and reach various portions on the substrate.

Figure 7:
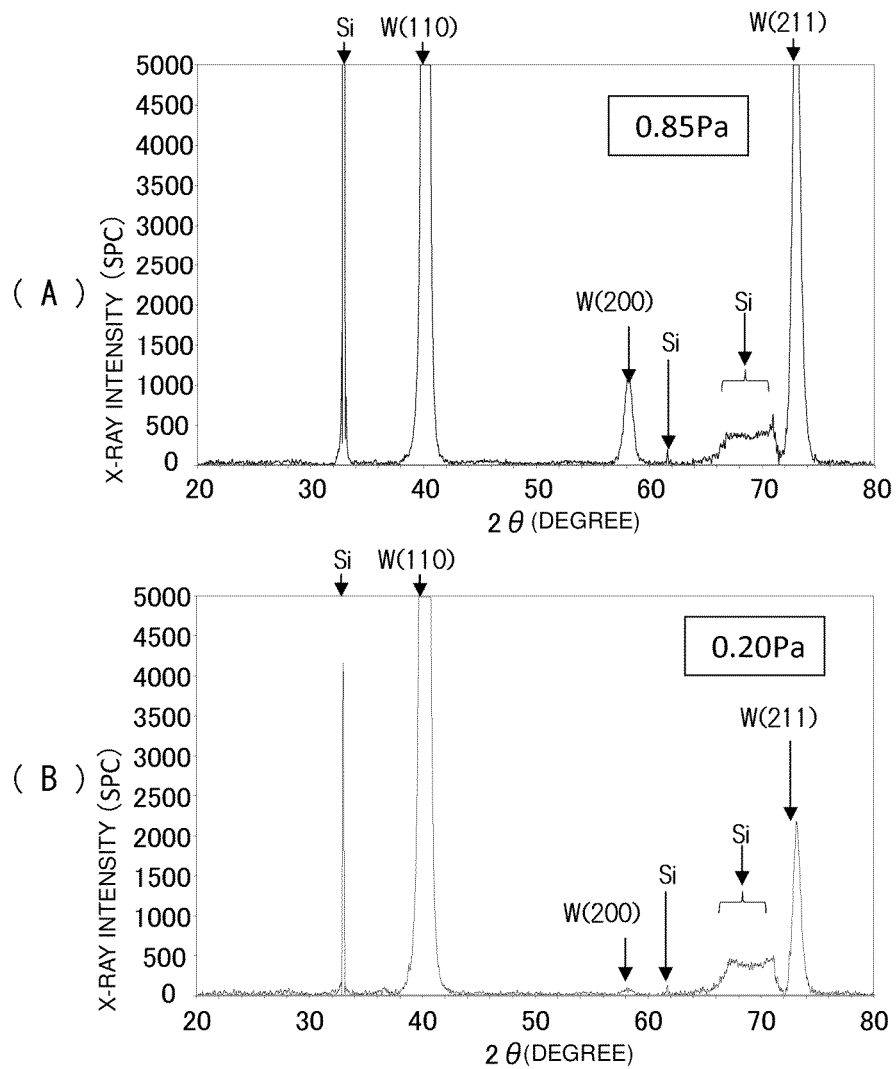
FIGS. 7(A) and 7(B) are views each showing x-ray diffraction intensity characteristics of the main electrode layer by way of example.

FIGS. 7(A) and 7(B) are views showing the results obtained by analyzing the crystalline structure of tungsten using an x-ray diffraction method (θ-2θ method). A sample used in this analysis includes a substrate formed of single crystalline silicon, a conductive layer formed from a titanium-tungsten alloy by a sputtering method on the substrate, and a conductive layer formed from tungsten by a sputtering method on the conductive layer formed of a titanium-tungsten alloy. In this case, the conductive layer formed of a titanium-tungsten alloy is an underlayer, and the conductive layer formed of tungsten is a main electrode layer. In particular, by a sputtering method which uses an argon gas and a target formed of a titanium-tungsten alloy, the content of titanium of which is 10 percent by weight, and which is performed at a sputtering electrical power of 2,000 W, a conductive layer having a thickness of 10 nm is formed from a titanium-tungsten alloy on the substrate, and on this conductive layer, by a sputtering method which uses an argon gas and a target formed of tungsten and which is performed at a sputtering electrical power of 500 W, a conductive layer having a thickness of 200 nm is formed from tungsten. In this case, the argon gas pressure is changed when the conductive layer is formed from a titanium-tungsten alloy, and subsequently, the crystalline structure of the conductive layer formed of tungsten is analyzed by an x-ray diffraction method (θ-2θ method).

FIG. 7(A) shows x-ray diffraction intensity characteristics obtained when analysis is performed by an x-ray diffraction method (θ-2θ method) on the crystalline structure of a conductive layer formed of tungsten on a conductive layer formed from a titanium-tungsten alloy at an argon gas pressure of 0.85 Pa in film formation.

As shown in FIG. 7(A), in this conductive layer, diffraction peaks of tungsten are present at approximately 40°, 58°, and 72°. The peak at approximately 40° is a diffraction peak from the (110) plane of tungsten. The peak at approximately 58° is a diffraction peak from the (200) plane of tungsten. The peak at approximately 72° is a diffraction peak from the (211) plane of tungsten. In addition, this conductive layer is formed of tungsten having a crystalline structure with a wavy-like surface morphology. In addition, at approximately 33°, 62°, and 70°, diffraction peaks of the substrate formed of single crystalline silicon are present. Although the diffraction peak of the substrate formed of single crystalline silicon detected at approximately 70° originally has a higher peak intensity, in order to easily visually recognize the diffraction peak from the (211) plane of tungsten at approximately 72°, the diffraction peak at approximately 70° is shown by correction to have a low peak intensity. In the following views, the correction similar to that described above is performed.

FIG. 7(B) shows x-ray diffraction intensity characteristics obtained when analysis is performed by an x-ray diffraction method (θ-2θ method) on the crystalline structure of a conductive layer formed of tungsten on a conductive layer formed from a titanium-tungsten alloy at an argon gas pressure of 0.2 Pa in film formation. As shown in FIG. 7(B), in this conductive layer, diffraction peaks of tungsten are present at approximately 40°, 58°, and 72°. The peak at approximately 40° is a diffraction peak from the (110) plane of tungsten. The peak at approximately 58° is a diffraction peak from the (200) plane of tungsten. The peak at approximately 72° is a diffraction peak from the (211) plane of tungsten. The peak intensity at approximately 58° is very low, and the peak intensity at approximately 72° is also very low. In addition, this conductive layer is formed of tungsten having a crystalline structure with a grain surface morphology. In addition, at approximately 33°, 62°, and 70°, diffraction peaks of the substrate formed of single crystalline silicon are present.

When the views shown in FIGS. 7(A) and 7(B) and the views shown in FIGS. 6(A) to 6(C) are compared with each other, it is found that between the conductive layer formed of a titanium-tungsten alloy functioning as the underlayer and the conductive layer formed of tungsten functioning as the main electrode layer, the positions of the diffraction peaks from the respective planes are not so much different from each other. This phenomenon indicates that since the underlayer is formed of a titanium-tungsten alloy having a crystalline structure with a wavy-like surface morphology, the main electrode layer is formed from tungsten so as to have a crystalline structure with a wavy-like surface morphology. Hence, by the crystalline structure of the underlayer, the crystalline structure of the main electrode layer may be approximately controlled.

Next, the influences of the crystalline structures of tungsten and a titanium-tungsten alloy to the resistivity of the thin film electrode will be described.

In the conductive layer formed of a titanium-tungsten alloy, the ratio TiW (200)/(110) of the peak intensity of the diffraction peak from the (200) plane to the peak intensity of the diffraction peak from the (110) plane is used as an index indicating the crystalline structure of the conductive layer formed of tungsten or a titanium-tungsten alloy.

Figure 8:
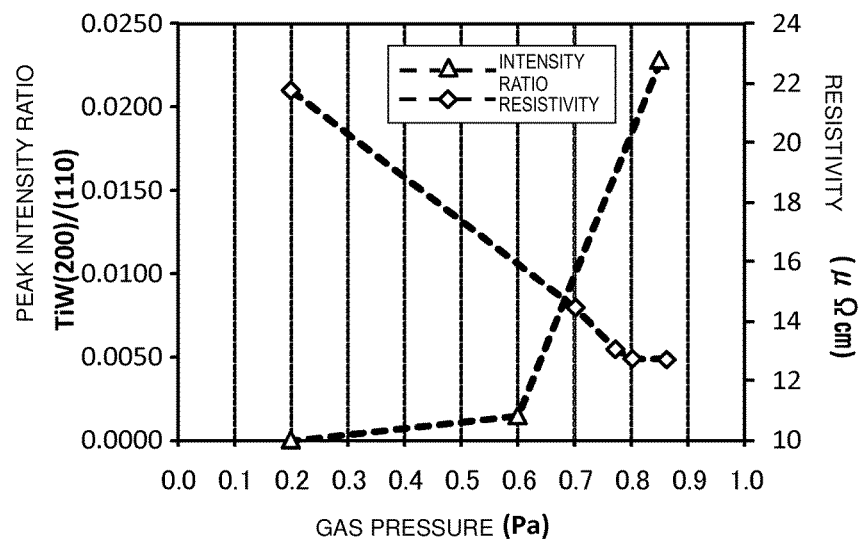
FIGS. 8(A) and 8(B) includes views showing the relationship by way of example among an argon gas pressure in film formation of the underlayer by a sputtering method, the ratio in peak intensity of the underlayer, and the resistivity of the main electrode layer.

FIG. 8(A) shows the relationship between the argon gas pressure in film formation by a sputtering method and the peak intensity ratio TiW (200)/(110) which is obtained based on the analysis result of the crystalline structure of a titanium-tungsten alloy using an x-ray diffraction method (θ-2θ method). In the conductive layer formed from a titanium-tungsten alloy at an argon gas pressure of 0.2 Pa in film formation, the peak intensity ratio TiW (200)/(110) is 0.0. In the conductive layer formed from a titanium-tungsten alloy at an argon gas pressure of 0.6 Pa in film formation, the peak intensity ratio TiW (200)/(110) is $1.4 \times 10^{-3}$. In the conductive layer formed from a titanium-tungsten alloy at an argon gas pressure of 0.85 Pa in film formation, the peak intensity ratio TiW (200)/(110) is $2.28 \times 10^{-2}$.

FIG. 8(B) shows the relationship among the argon gas pressure in film formation of a titanium-tungsten alloy by a sputtering method, the peak intensity ratio TiW (200)/(110), and the resistivity of the conductive layer of tungsten formed on a titanium-tungsten alloy by a sputtering method. Although the sampling intervals of the sputtering gas pressure for sampling the peak intensity ratio and the resistivity are not constant, from a qualitative point of view, it can be assumed that the peak intensity and the resistivity are each linearly changed between the samples. Hence, hereinafter, the description will be made based on the assumption in which the peak intensity and the resistivity are each linearly changed between the samples.

In the conductive layer formed from a titanium-tungsten alloy at an argon gas pressure of 0.2 Pa in film formation, the peak intensity ratio TiW (200)/(110) is 0.0, and the resistivity of the conductive layer formed of tungsten is approximately 22 μΩ·cm. In the conductive layer formed from a titanium-tungsten alloy at an argon gas pressure of 0.6 Pa in film formation, the peak intensity ratio TiW (200)/(110) is $1.4 \times 10^{-3}$, and the resistivity of the conductive layer formed of tungsten is approximately 15 μΩ·cm. In the conductive layer formed from a titanium-tungsten alloy at an argon gas pressure of 0.85 Pa in film formation, the peak intensity ratio TiW (200)/(110) is $2.28 \times 10^{-2}$, and the resistivity of the conductive layer formed of tungsten is approximately 13 μΩ·cm.

From the results described above, it is found that by increasing the argon gas pressure when a conductive layer functioning as the underlayer is formed from a titanium-tungsten alloy by a sputtering method, the peak intensity ratio TiW (200)/(110) can be increased, and the resistivity of the conductive layer formed of tungsten functioning as the main electrode layer can be decreased.

In addition, it is found that when the conductive layer is formed from a titanium-tungsten alloy at an argon gas pressure of 0.6 Pa or more in film formation, the peak intensity ratio TiW (200)/(110) is $1.4 \times 10^{-3}$ or more, and the resistivity of the conductive layer formed of tungsten becomes constant at approximately 13 μΩ·cm.

Next, the influence of the argon gas pressure in film formation of a conductive layer from tungsten by a sputtering method to the internal stress of the thin film electrode will be described.

As described above, since the crystalline structure of the conductive layer formed of tungsten functioning as the main electrode layer can be controlled by the crystalline structure of the conductive layer formed of a titanium-tungsten alloy functioning as the underlayer, the conditions in film formation of tungsten by a sputtering method can be arbitrarily determined.

Figure 9:
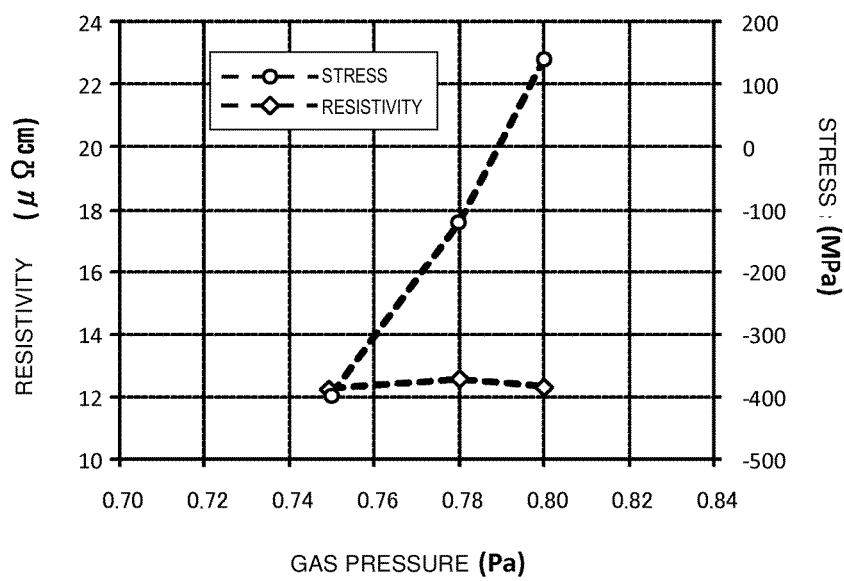
FIG. 9 is a view showing the relationship by way of example among an argon gas pressure in film formation of the main electrode layer by a sputtering method, the resistivity of the main electrode layer, and the internal stress thereof.

As is the case shown in FIGS. 7(A) and 7(B), in the structure in which on the conductive layer which is formed from a titanium-tungsten alloy by a sputtering method on the substrate formed of single crystalline silicon, the conductive layer is formed from tungsten by a sputtering method, FIG. 9 shows the relationship among the argon gas pressure in film formation of a conductive layer of tungsten by a sputtering method, the internal stress of the conductive layer formed of tungsten, and the resistivity thereof.

As shown in FIG. 9, it is found that in the conductive layer formed of tungsten functioning as the main electrode layer, when the argon gas pressure in film formation is changed, the internal stress of the conductive layer formed of tungsten is changed. In particular, it is found that when the argon gas pressure in film formation of a conductive layer of tungsten functioning as the main electrode layer by a sputtering method is increased, the internal stress becomes a tensile stress, and when the gas pressure is decreased, the internal stress becomes a compressive stress. On the other hand, the resistivity of the conductive layer formed of tungsten is not substantially changed by the gas pressure. Hence, it is found that the internal stress of the main electrode layer can be arbitrarily set without giving any substantial influence to the resistivity.

That is, when the argon gas pressure in film formation of the conductive layer of a titanium-tungsten alloy functioning as the underlayer by a sputtering method is controlled so as to determine the crystalline structure of the conductive layer formed of tungsten functioning as the main electrode layer in advance, by control of the argon gas pressure in film formation of the conductive layer of tungsten functioning as the main electrode layer by a sputtering method, the internal stress of the conductive layer formed of tungsten can be determined independently of the resistivity thereof. Hence, when the internal stress of the main electrode layer is set so as to be equivalent to the internal stress acting on the moving plate and the moving plate-side thin film electrodes, the moving plate and the moving plate-side thin film electrodes can be prevented from being deformed.

As has thus been described, according to the thin film device of this embodiment, when the underlayer formed of a titanium-tungsten alloy having a crystalline structure with a wavy-like surface morphology is provided, a high adhesion between the main electrode layer formed of tungsten and the moving plate formed of silicon and provided with a silicon dioxide film on the surface thereof can be secured, and in addition, when the main electrode layer formed of tungsten having a crystalline structure with a wavy-like surface morphology is provided, the resistivity of the main electrode layer can be decreased. In addition, a highly reliable and a low power-consumption variable capacity element can be formed.

Next, as for a thin film device of a second exemplary embodiment, a variable capacity element which is an MEMS device will be described as one example of the thin film device.

Figure 10:
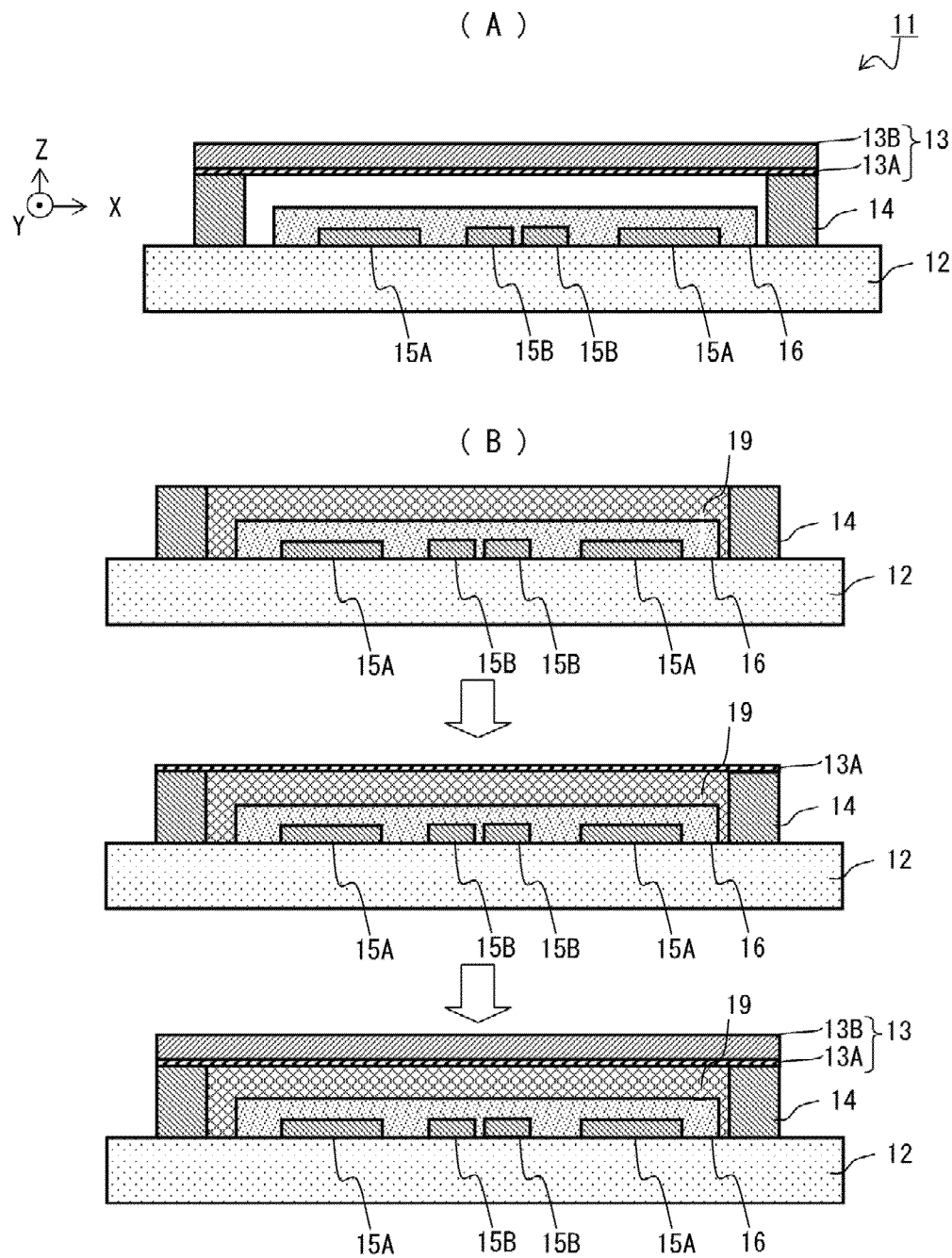
FIGS. 10(A) and 10(B) are views each illustrating the structure of a thin film device of a second exemplary embodiment.

FIG. 10(A) is a transverse cross-sectional view (X-Z cross-sectional view) of a variable capacity element 11 of this embodiment.

As shown in FIG. 10(A), the variable capacity element 11 includes a fixed plate 12, a moving electrode plate 13, and a frame portion 14.

The fixed plate 12 is a flat plate formed of a glass or single crystalline silicon, and the normal direction of the primary surface thereof is a Z-axis direction. The moving electrode plate 13 is a flat plate in which a Z-axis direction and an X-axis direction thereof are called a thickness direction and a longitudinal direction, respectively, and is formed of an underlayer 13A and a main electrode layer 13B laminated thereon. For example, the underlayer 13A has a thickness of 10 nm, and the main electrode layer 13B has a thickness of 500 nm.

The underlayer 13A is formed of a titanium-tungsten alloy, and the main electrode layer 13B is formed of tungsten. In particular, the underlayer 13A is formed of a titanium-tungsten alloy having a crystalline structure with a wavy-like surface morphology, and the main electrode layer 13B is formed of tungsten having a crystalline structure with a wavy-like surface morphology. The underlayer 13A and the main electrode layer 13B are each formed by a sputtering method. Since having a crystalline structure with a wavy-like surface morphology, the main electrode layer 13B has a low resistivity.

The frame portion 14 is bonded to the fixed plate 12 and is also bonded to two ends (fixed ends) of the moving electrode plate 13 in a longitudinal direction thereof. As described above, the frame portion 14 supports the moving electrode plate 13 so that the moving electrode plate 13 faces the fixed plate 12 with a gap space interposed therebetween.

Fixed plate-side thin film electrodes 15A and 15B and a dielectric film 16 are provided on a surface of the fixed plate 12 facing the moving electrode plate 13. The fixed plate-side thin film electrodes 15A and 15B are arranged on the primary surface of the fixed plate 12 in the X-axis direction. The fixed plate-side thin film electrodes 15A and 15B are formed to face the moving electrode plate 13. The dielectric film 16 covers part of the primary surface of the fixed plate 12 and the fixed plate-side thin film electrodes 15A and 15B and is provided over approximately the entire region of the primary surface of the fixed plate 12 that faces the moving electrode plate 13.

The moving electrode plate 13 and the fixed plate-side thin film electrodes 15A are each a drive electrode. When a drive DC voltage is applied between the moving electrode plate 13 and the fixed plate-side thin film electrodes 15A facing thereto, a drive capacity is formed between the moving electrode plate 13 and the fixed plate-side thin film electrodes 15A, and an electrostatic attractive force is generated. When the drive DC voltage is increased, the drive capacity and also the electrostatic attractive force are increased. As a result, the moving electrode plate 13 moves from a central portion thereof toward the dielectric film 16 and is brought into contact with the dielectric film 16 from the central portion of the moving electrode plate 13. The contact area between the moving electrode plate 13 and the dielectric film 16 is continuously changed in accordance with the drive DC voltage. While the moving electrode plate 13 is in contact with the dielectric film 16, when the drive DC voltage is decreased or is set to zero, the drive capacity and also the electrostatic attractive force are decreased or set to zero. As a result, the moving electrode plate 13 is returned to a predetermined state by the elasticity thereof, and hence, the moving electrode plate 13 moves apart from the dielectric film 16.

The moving electrode plate 13 and the fixed plate-side thin film electrodes 15B are each an RF capacity electrode. Between the moving electrode plate 13 and the fixed plate-side thin film electrodes 15B facing thereto, an RF capacity (capacitance) is formed. This RF capacity is continuously changed in accordance with the distance between the moving electrode plate 13 and the dielectric film 16 and the contact area therebetween. Hence, in the variable capacity element 11, an RF capacity which is continuously changed in accordance with the drive DC voltage is formed.

FIG. 10(B) includes views each illustrating part of a method for manufacturing the variable capacity element 11. First, the fixed plate 12 is prepared on which the fixed plate-side thin film electrodes 15A and 15B, the frame portion 14, and the dielectric film 16 are formed, and a sacrifice layer 19 is provided in a region to be formed into the gap space. In this embodiment, the sacrifice layer 19 is formed of silicon dioxide.

Next, on upper surfaces of the sacrifice layer 19 and the frame portion 14, a film is formed from a titanium-tungsten alloy by a sputtering method, so that the underlayer 13A is formed.

Next, on an upper surface of the underlayer 13A, a film is formed from tungsten by a sputtering method, so that the main electrode layer 13B is formed.

In addition, by using an etchant having a selectivity to silicon dioxide, the sacrifice layer 19 is removed by wet etching. For example, hydrofluoric acid (HF) to which tungsten and a titanium-tungsten alloy have corrosion resistance may be used as an etchant.

By the steps described above, a variable capacity element 11 which realizes a low resistivity in the moving electrode plate 13 can be manufactured. Even when a moving plate and a moving plate-side thin film electrode are integrally formed to obtain a moving electrode plate, if the underlayer 13A formed of a titanium-tungsten alloy having a crystalline structure with a wavy-like surface morphology and the main electrode layer 13B formed of tungsten having a crystalline structure with a wavy-like surface morphology are provided, the resistivity of the main electrode layer can be decreased.

Next, as for a thin film device of a third exemplary embodiment, a piezoelectric thin film resonator will be described by way of example.

Figure 11:
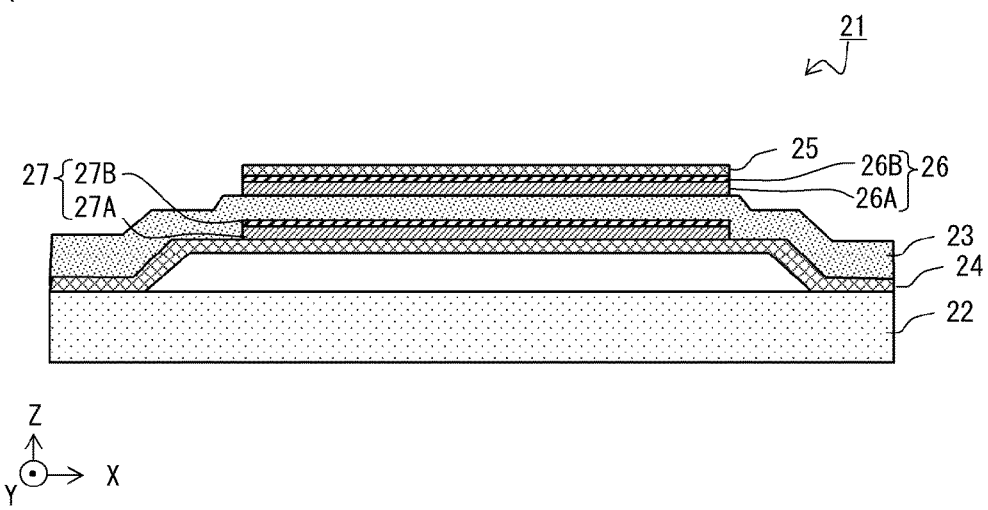
FIG. 11 is a view illustrating the structure of a thin film device of a third exemplary embodiment.

FIG. 11 is a transverse cross-sectional view (X-Z cross-sectional view) of a piezoelectric thin film resonator 21 of this embodiment.

The piezoelectric thin film resonator 21 includes a fixed plate 22, a piezoelectric film 23, a protective film 24, a frequency adjusting film 25, an upper-side thin film electrode 26, and a lower-side thin film electrode 27.

The fixed plate 22 is a flat plate formed of single crystalline silicon, and the normal direction of the primary surface thereof is a Z-axis direction. The protective film 24, the lower-side thin film electrode 27, the piezoelectric film 23, the upper-side thin film electrode 26, and the frequency adjusting film 25 are laminated in this order, and a membrane structure is formed in which the lower-side thin film electrode 27 and the upper-side thin film electrode 26 facing thereto with the piezoelectric film 23 interposed therebetween float up from the fixed plate 22. The piezoelectric film 23 is formed of aluminum nitride (AlN), and the upper-side thin film electrode 26 and the lower-side thin film electrode 27 are provided on an upper surface and a lower surface, respectively, of the piezoelectric film 23. When a predetermined frequency signal is applied between these two thin film electrodes, the piezoelectric film 23 is vibrated in a resonance mode of thickness longitudinal vibration. The protective film 24 and the frequency adjusting film 25 are thin films each formed of silicon dioxide, the protective film 24 is provided under the lower-side thin film electrode 27 and the piezoelectric film 23, and the frequency adjusting film 25 is formed on the upper-side thin film electrode 26.

The upper-side thin film electrode 26 includes an underlayer 26A and a main electrode layer 26B. The underlayer 26A is formed on an upper surface of the piezoelectric film 23 by a sputtering method, and the main electrode layer 26B is formed on an upper surface of the underlayer 26A by a sputtering method. The lower-side thin film electrode 27 includes an underlayer 27A and a main electrode layer 27B. The underlayer 27A is formed on an upper surface of the protective film 24 by a sputtering method, and a main electrode layer 27B is formed on an upper surface of the underlayer 27A by a sputtering method.

The underlayers 26A and 27A are each formed of a titanium-tungsten alloy, and the main electrode layers 26B and 27B are each formed of tungsten. In particular, the underlayers 26A and 27A are each formed of a titanium-tungsten alloy having a crystalline structure with a wavy-like surface morphology, and the main electrode layers 26B and 27B are each formed of tungsten having a crystalline structure with a wavy-like surface morphology. Since the main electrode layers 26B and 27B are each formed of tungsten having a crystalline structure with a wavy-like surface morphology, a low resistivity can be obtained.

According to the piezoelectric thin film resonator 21 having the structure as described above, since the upper-side thin film electrode 26 and the lower-side thin film electrode 27 each have a low resistivity, the insertion loss can be reduced, and a low power consumption can be realized. In addition, a high adhesion of the protective film 24 and the frequency adjusting film 25, each of which is formed of silicon dioxide, to the individual thin film electrode portions 26 and 27 can be realized. In addition, since a titanium-tungsten alloy and tungsten each have a high Young's modulus and a high density, the acoustic impedance is high. Hence, vibration is concentrated to the piezoelectric film 23, and a large fractional bandwidth and a high Q value can be realized.

Although embodiments according to the present disclosure can be performed as described in the above exemplary embodiments, besides the cases described above, additional applications according to the present disclosure include other thin film devices as long as a thin film electrode containing tungsten as a primary component is used. For example, the thin film electrode of the present disclosure can also be applied to a common substrate wire.

In embodiments consistent with the present disclosure, because the underlayer is formed of a titanium-tungsten alloy having a crystalline structure with a wavy-like surface morphology, and the main electrode layer is formed of tungsten having a crystalline structure with a wavy-like surface morphology, the resistivity of the thin film electrode is decreased. In addition, according to the present disclosure, since the underlayer is formed of a titanium-tungsten alloy having diffraction peaks from the (110) plane, the (200) plane, and the (211) plane by an x-ray diffraction method, and the main electrode layer is formed of tungsten, the resistivity of the thin film electrode is decreased.

Further, because tungsten having a crystalline structure with a wavy-like surface morphology has a low resistivity, the resistivity of the thin film electrode is decreased. In addition, a titanium-tungsten alloy is excellent in adhesion not only to tungsten but also to various materials, such as a silicon dioxide ($SiO_2$) film. Hence, a titanium-tungsten alloy is suitably used as the underlayer for the main electrode layer formed of tungsten.

Additionally, besides excellent adhesion to tungsten, a titanium-tungsten alloy is also excellent in adhesion to various materials, such as a silicon dioxide ($SiO_2$) film. Hence, a titanium-tungsten alloy is suitably used as the underlayer for the main electrode layer formed of tungsten. In addition, tungsten having diffraction peaks from the (110) plane, the (200) plane, and the (211) plane by an x-ray diffraction method has a low resistivity, and hence, the resistivity of the thin film electrode is decreased.

That which is claimed is:

1. A thin film device comprising:
   a thin film electrode including an underlayer and a main electrode layer formed on the underlayer, the underlayer being formed of a titanium-tungsten alloy having a crystalline structure with a wavy-like surface morphology, and the main electrode layer being formed of tungsten having a crystalline structure with a wavy-like surface morphology; and
   a plate including a fixed thin film electrode,
   wherein the thin film electrode is provided to flex toward the fixed thin film electrode of the plate with application of DC voltage across the thin film electrode and the fixed thin film electrode.

2. The thin film device according claim 1,
   wherein in the underlayer, a ratio of the peak intensity of the diffraction peak from the (200) plane to the peak intensity of the diffraction peak from the (110) plane by an x-ray diffraction method is $1.4 \times 10^{-3}$ or more.

3. The thin film device according to claim 1,
   further comprising a silicon dioxide film formed under the underlayer.

4. A method for manufacturing the thin film device according to claim 1, the method comprising:
   an underlayer forming step of forming the underlayer at a gas pressure of 0.65 Pa or more in film formation by a sputtering method; and
   a main electrode-layer forming step of forming the main electrode layer on the underlayer.

5. A thin film device comprising:
   a thin film electrode including an underlayer and a main electrode layer formed on the underlayer, the underlayer being formed of a titanium-tungsten alloy having diffraction peaks from the (110) plane, the (200) plane, and the (211) plane by an x-ray diffraction method, and the main electrode layer being formed of tungsten; and
   a plate including a fixed thin film electrode,
   wherein the thin film electrode is provided to flex toward the fixed thin film electrode of the plate with application of DC voltage across the thin film electrode and the fixed thin film electrode.

6. The thin film device according to claim 5,
   wherein the main electrode layer is formed of tungsten having diffraction peaks from the (110) plane, the (200) plane, and the (211) plane by an x-ray diffraction method.

7. The thin film device according to claim 5,
   wherein in the underlayer, a ratio of the peak intensity of the diffraction peak from the (200) plane to the peak intensity of the diffraction peak from the (110) plane by an x-ray diffraction method is $1.4 \times 10^{-3}$ or more.

8. The thin film device according to claim 5,
   further comprising a silicon dioxide film formed under the underlayer.

9. A method for manufacturing the thin film device according to claim 5, the method comprising:
   an underlayer forming step of forming the underlayer at a gas pressure of 0.65 Pa or more in film formation by a sputtering method; and
   a main electrode-layer forming step of forming the main electrode layer on the underlayer.

* * * * *